US010026666B2

(12) United States Patent
Juneja et al.

(10) Patent No.: US 10,026,666 B2
(45) Date of Patent: Jul. 17, 2018

(54) STACKED DIE PACKAGE WITH ALIGNED ACTIVE AND PASSIVE THROUGH-SILICON VIAS

(71) Applicant: Rambus Inc., Sunnyvale, CA (US)

(72) Inventors: Nitin Juneja, Fremont, CA (US); Wendemagegnehu Beyene, San Jose, CA (US); David A. Secker, San Jose, CA (US); Ely K. Tsern, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 18 days.

(21) Appl. No.: 14/513,871

(22) Filed: Oct. 14, 2014

(65) Prior Publication Data

US 2015/0108656 A1    Apr. 23, 2015

Related U.S. Application Data

(60) Provisional application No. 61/893,127, filed on Oct. 18, 2013.

(51) Int. Cl.
*H01L 23/48* (2006.01)
*H01L 23/52* (2006.01)
(Continued)

(52) U.S. Cl.
CPC ........ *H01L 23/13* (2013.01); *H01L 23/49816* (2013.01); *H01L 23/49833* (2013.01);
(Continued)

(58) Field of Classification Search
CPC ............. H01L 25/0652; H01L 25/0655; H01L 25/071; H01L 25/073; H01L 25/0756;
(Continued)

(56) References Cited

U.S. PATENT DOCUMENTS 7,405,477 B1 * 7/2008 Tao ................... H01L 23/49838
257/659
7,816,776 B2   10/2010 Choi
(Continued)

FOREIGN PATENT DOCUMENTS

WO  WO-2010-138480 A2   12/2010
WO  WO-2011-049710 A2   4/2011
WO  WO-2013-025205 A1   2/2013

OTHER PUBLICATIONS

Amir et al., "3D Packaging, Interconnection & Assembly," 2013 Slidedeck downloaded from http://www.smta.org/chapters/files/Oregon_3D_Packaging_SMTA_CTP_2013_(Version_C).pdf, pp. 1-196. 196 pages.
(Continued)

*Primary Examiner* — Kimberly Rizkallah
*Assistant Examiner* — Dilinh Nguyen
(74) *Attorney, Agent, or Firm* — The Neudeck Law Firm, LLC

(57) ABSTRACT

Disclosed is a package-on-package (PoP) assembly comprises a two-tiered windowed ball grid array (BGA) and a system on a chip (SoC) package. Window openings in the two tiers of the BGA are of different sizes to allow for wirebond landing pads on the first tier. A DRAM die is mounted to the BGA flipped over (i.e., wirebond pads facing the BGA package.) The DRAM die is wirebonded through the window in the BGA. For multi-channel systems and higher memory capacity, the DRAM die will have low-cost through-silicon vias (TSVs) that connect to stacked DRAM die(s). The stacked DRAM dies may be offset or rotated to align active TSVs with passive TSVs thereby enabling unique connections to certain DRAM dies in the stack.

14 Claims, 10 Drawing Sheets

(51) Int. Cl.
  *H01L 29/40* (2006.01)
  *H01L 23/13* (2006.01)
  *H01L 25/065* (2006.01)
  *H01L 23/498* (2006.01)
  *H01L 25/18* (2006.01)
  *H01L 23/00* (2006.01)

(52) U.S. Cl.
  CPC .............. *H01L 24/48* (2013.01); *H01L 24/73* (2013.01); *H01L 25/0657* (2013.01); *H01L 23/481* (2013.01); *H01L 24/05* (2013.01); *H01L 24/06* (2013.01); *H01L 24/16* (2013.01); *H01L 25/18* (2013.01); *H01L 2224/0401* (2013.01); *H01L 2224/04042* (2013.01); *H01L 2224/0557* (2013.01); *H01L 2224/05548* (2013.01); *H01L 2224/05571* (2013.01); *H01L 2224/06181* (2013.01); *H01L 2224/131* (2013.01); *H01L 2224/13025* (2013.01); *H01L 2224/16146* (2013.01); *H01L 2224/17181* (2013.01); *H01L 2224/4824* (2013.01); *H01L 2224/48091* (2013.01); *H01L 2224/49* (2013.01); *H01L 2224/73257* (2013.01); *H01L 2225/0651* (2013.01); *H01L 2225/0652* (2013.01); *H01L 2225/06513* (2013.01); *H01L 2225/06517* (2013.01); *H01L 2225/06544* (2013.01); *H01L 2225/06572* (2013.01); *H01L 2924/00014* (2013.01); *H01L 2924/1436* (2013.01); *H01L 2924/1517* (2013.01); *H01L 2924/15311* (2013.01)

(58) Field of Classification Search
  CPC .................. H01L 25/117; H01L 25/162; H01L 23/49827; H01L 25/0657; H01L 24/17; H01L 24/49; H01L 2224/49; H01L 25/18; H01L 25/06572; H01L 2225/06517; H01L 2225/06544; H01L 2225/0652; H01L 2225/0651; H01L 2225/06513; H01L 2225/06572; H01L 2225/065172
  USPC .......................... 257/774, 686, 777, 778, 786
  See application file for complete search history.

(56) References Cited

U.S. PATENT DOCUMENTS

| | | |
|---|---|---|
| 7,898,834 B2 | 3/2011 | Kim et al. |
| 7,948,093 B2 | 5/2011 | Fjelstad |
| 8,258,619 B2 | 9/2012 | Foster, Sr. et al. |
| 8,432,027 B2 | 4/2013 | Foster, Sr. et al. |
| 8,436,477 B2 | 5/2013 | Crisp et al. |
| 8,513,817 B2 * | 8/2013 | Haba ........................ H01L 24/06 257/723 |
| 2003/0064547 A1 * | 4/2003 | Akram ................. H01L 23/5386 438/108 |
| 2007/0057384 A1 | 3/2007 | Alam et al. |
| 2008/0088031 A1 | 4/2008 | Kwon et al. |
| 2010/0289131 A1 | 11/2010 | Bathan et al. |
| 2011/0050320 A1 | 3/2011 | Gillingham |
| 2011/0204505 A1 * | 8/2011 | Pagaila ................. H01L 21/568 257/686 |
| 2012/0280860 A1 * | 11/2012 | Kamgaing ........... H01Q 1/2283 342/368 |

OTHER PUBLICATIONS

Kang et al., "8Gb 3D DDR3 DRAM Using Through-Silicon-Via Technology," IEEE International Solid-State Circuits Conference, 2009. 3 pages.

* cited by examiner

STACKED DIE PACKAGE WITH ALIGNED ACTIVE AND PASSIVE THROUGH-SILICON VIAS

CROSS-REFERENCE TO RELATED APPLICATIONS

The present application claims the benefit of U.S. Provisional Application Ser. No. 61/893,127, filed Oct. 18, 2013, and titled HIGH PERFORMANCE PACKAGE ON PACKAGE MEMORY SYSTEM, which is hereby incorporated herein by reference for all purposes.

DETAILED DESCRIPTION OF THE EMBODIMENTS

A package-on-package (PoP) assembly comprises a two-tiered windowed ball grid array (BGA) and a system on a chip (SoC) package. In an embodiment, the BGA package includes memory integrated circuit dies and the system on a chip (SoC) package includes an SoC integrated circuit die. The window openings in the two tiers of the BGA are of two different sizes to allow for wirebond landing pads on the first tier. The two-tiered package also provides room for protecting the wirebonds with a mold cap.

To assemble the memory die on the BGA package, a DRAM die is mounted to the BGA flipped over (i.e., wirebond pads facing the BGA package.) The DRAM die is wirebonded through the window in the BGA. These wirebonds are expected to be relatively shorter in length than bonding with wirebond pads of a DRAM die facing away from the BGA package (i.e., face up.) The wirebonds are connected to package BGA balls with package traces on the tiers of the package. For multi-channel systems and higher memory capacity, the DRAM die can have low-cost through-silicon vias (TSVs) that connect to stacked DRAM die(s). Since TSVs are used to connect to the stacked dies, the density of wirebonds is reduced. This packaging construction and integration of memory system reduces losses, crosstalk, and increases channel bandwidth.

Figure 1:
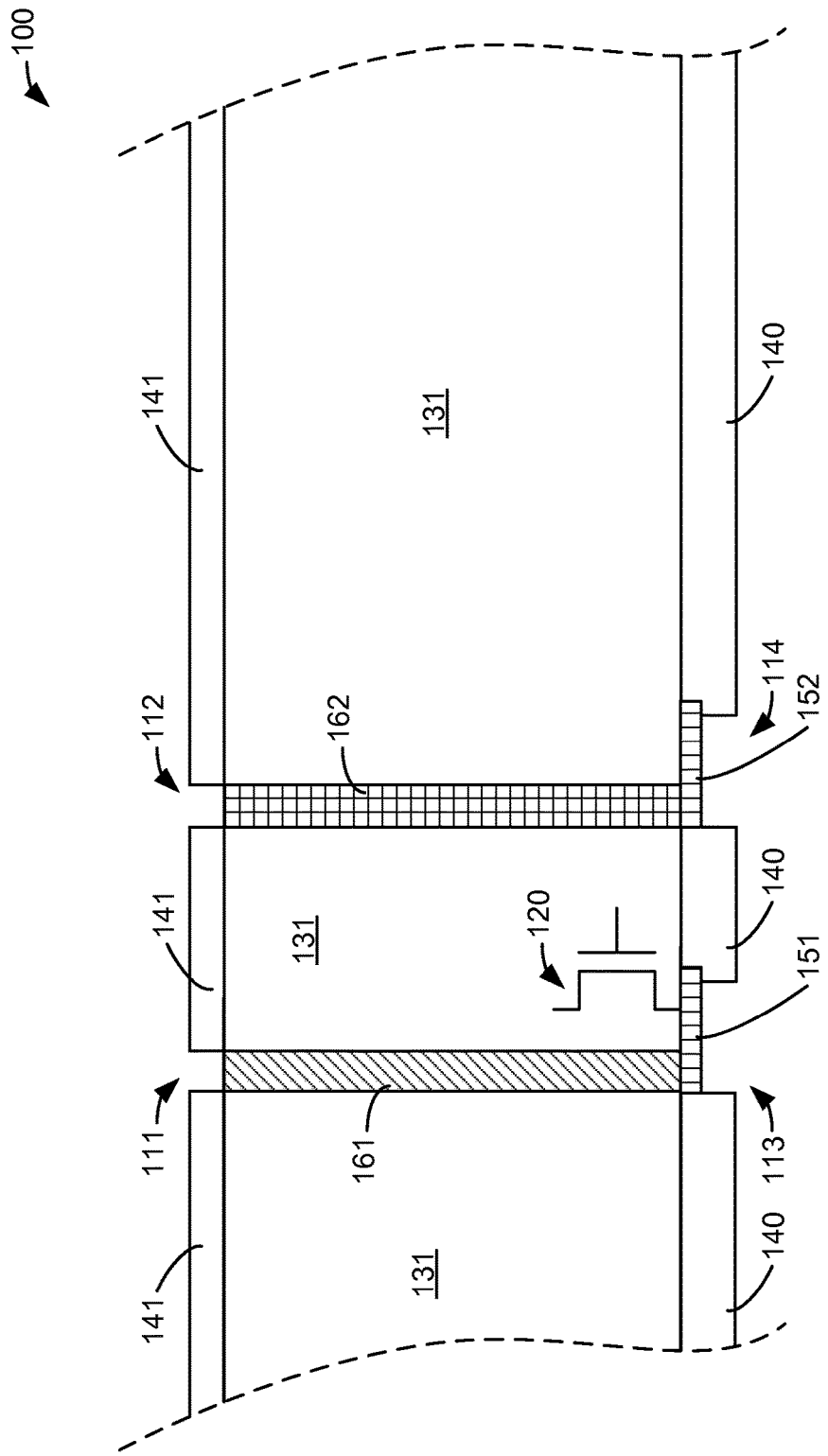
FIG. 1 is an illustration of a stackable integrated circuit die with through-silicon vias.

FIG. 1 is an illustration of a stackable integrated circuit die with through-silicon vias. In FIG. 1, integrated circuit die 100 includes active circuitry 120, substrate 131, passivation layer 140, passivation layer 141, wirebond pad 151, wirebond pad 152, active TSV 161, and passive TSV 162. Circuitry 120 is illustrated as being integrated with substrate 131. Thus, it should be understood that an 'active' TSV refers to through-silicon vias that are connected to at least a portion of the active circuitry of an integrated circuit die (e.g., die 100). In other words, an 'active' TSV is a TSV which has active circuits driving or sensing a connection coupled to the TSV interconnect on a given integrated circuit die. A 'passive' TSV refers to through-silicon vias that are not actively used or connected to the active circuitry of an integrated circuit die (e.g., die 100) and are instead typically used as 'pass-through' connections to other circuitry, packages, or integrated circuit die. In other words, a 'passive' TSV is a TSV which can be configured to, or does not have, any active circuits driving or sensing a connections coupled to the TSV interconnect on a given integrated circuit die.

Active TSV 161 is illustrated as being connected to circuitry 120. Passive TSV 162 is not illustrated as connected to circuitry that is integrated with substrate 131. Passivation layer 140 is illustrated on the side of integrated circuit die 100 that includes circuitry 120 (a.k.a. the 'front' or 'top' side of integrated circuit die 100.) Passivation layer 141 is illustrated on the side of integrated circuit die 100 that does not include active circuitry (a.k.a. the 'back' or 'bottom' side of integrated circuit die 100.)

Passivation layer 140 includes passivation opening 113 that exposes a connection to active TSV 161. Passivation layer 140 includes passivation opening 114 that exposes a connection to passive TSV 162. In particular, in FIG. 1, passivation layer 140 is illustrated as including passivation opening 113 and passivation opening 114 that expose connections to active TSV 161 using wirebond pad 151 and passive TSV 162, respectively. Passivation layer 141 includes passivation opening 111 that exposes a connection to active TSV 161. Passivation layer 141 includes passivation opening 112 that exposes a connection to passive TSV 162.

Figure 2A:
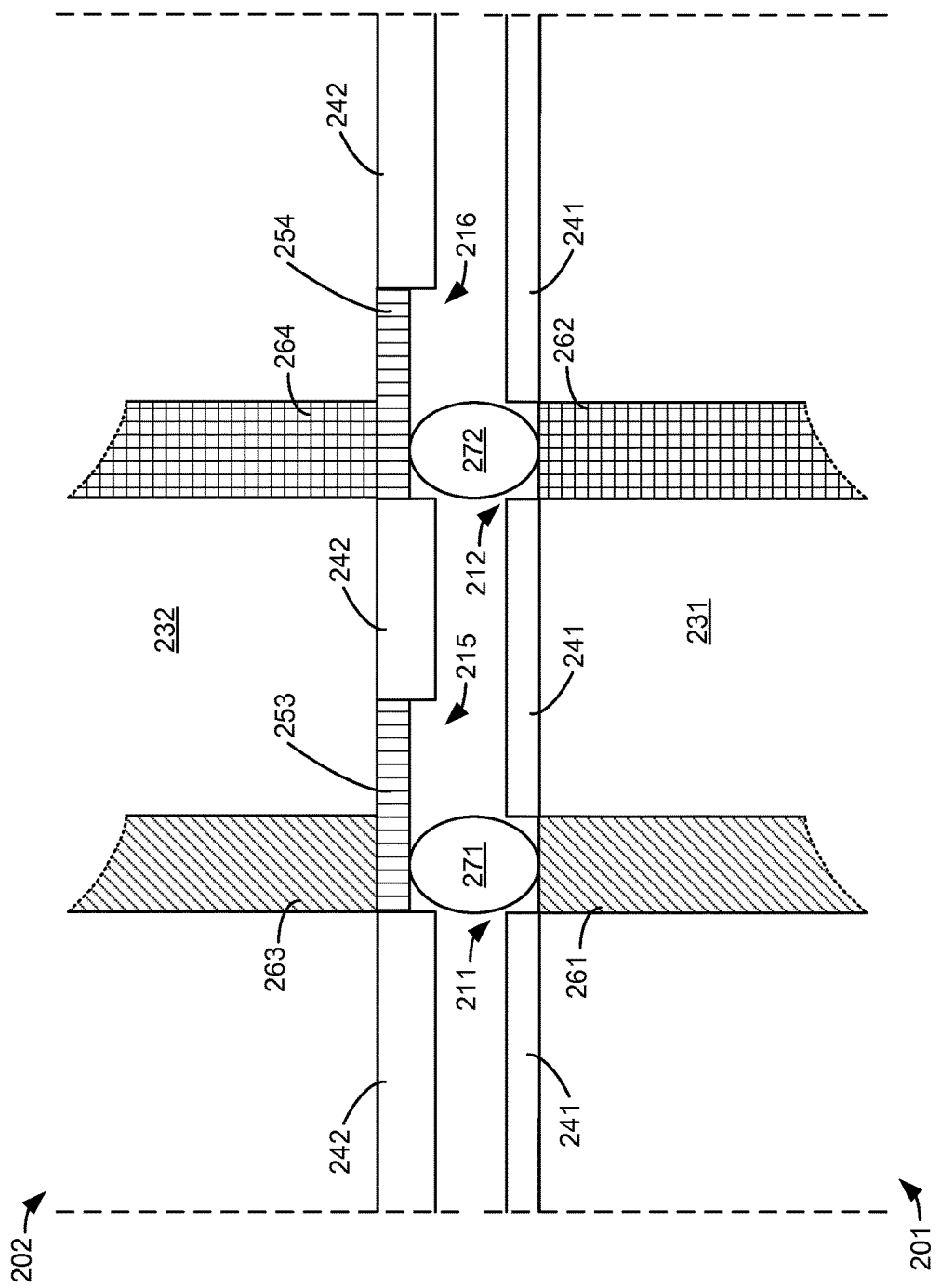
FIG. 2A is an illustration of die stacked with active-to-active and passive-to-passive connected through-silicon vias.

FIG. 2A is an illustration of die stacked with active-to-active and passive-to-passive connected through-silicon vias. In FIG. 2A, integrated circuit die 202 is illustrated stacked on integrated circuit die 201. Integrated circuit die 202 and integrated circuit 201 are illustrated 'face-down' (i.e., towards the bottom of FIG. 2A) such that the active circuitry of integrated circuit die 202 is facing the 'back' of integrated circuit die 201.

In FIG. 2A, the portion of integrated circuit die 201 illustrated includes substrate 231, passivation layer 241, active TSV 261, and passive TSV 262. Passivation layer 241 includes passivation opening 211 that exposes a connection to active TSV 261. Passivation layer 241 includes passivation opening 212 that exposes a connection to passive TSV 262. The portion of integrated circuit die 202 illustrated includes substrate 232, passivation layer 242, wirebond pad 253, wirebond pad 254, active TSV 263, and passive TSV 264. Passivation layer 242 includes passivation opening 215 that exposes a connection to active TSV 263. Passivation layer 242 includes passivation opening 216 that exposes a connection to passive TSV 264. In particular, in FIG. 2A, passivation layer 242 is illustrated as including passivation opening 215 and passivation opening 216 that expose connections to active TSV 263 using wirebond pad 253 and passive TSV 264 using wirebond pad 254, respectively.

In FIG. 2A, integrated circuit die 201 and integrated circuit die 202 are stacked and aligned such that active TSV 261 is aligned with active TSV 263 and passive TSV 262 is aligned with passive TSV 264. Connection 271 makes use of the alignment between active TSV 261 and active TSV 263 to connect active TSV 261 to active TSV 263. Connection 272 makes use of the alignment between passive TSV 262 and passive TSV 264 to connect passive TSV 262 to passive TSV 264. In an embodiment, connection 271 and/or connection 272 may be part of a TSV, metallization, a solder bump, a solder ball, or other 'flip-chip' type connection.

Figure 2B:
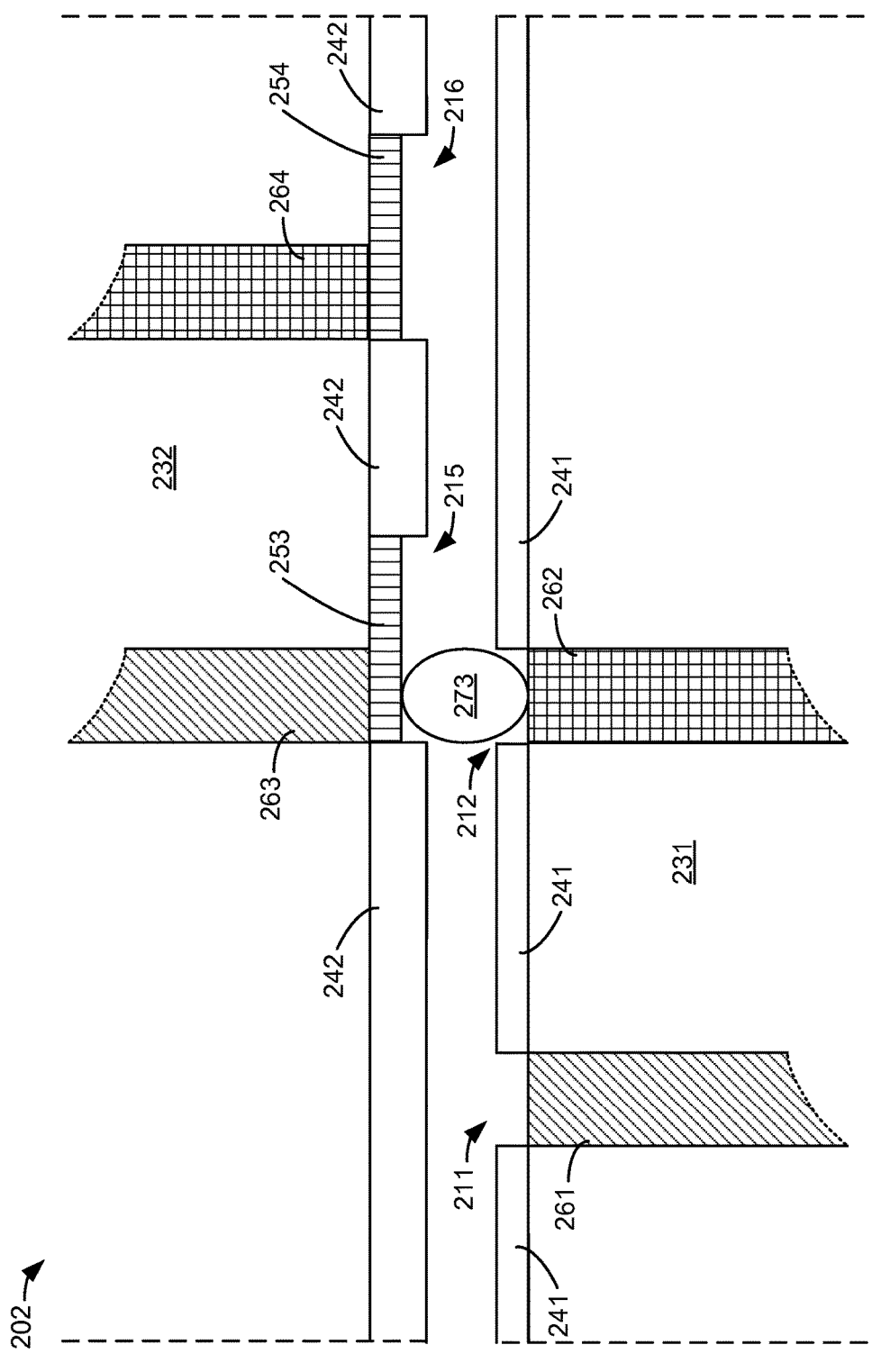
FIG. 2B is an illustration of die stacked with active-to-passive connected through-silicon vias.

FIG. 2B is an illustration of die stacked with active-to-passive connected through-silicon vias. In FIG. 2B, integrated circuit die 202 is illustrated stacked on integrated circuit die 201. Integrated circuit die 202 and integrated circuit 201 are illustrated 'face-down' (i.e., towards the bottom of FIG. 2B such that the active circuitry of integrated circuit die 202 is facing the 'back' of integrated circuit die 201.

In FIG. 2B, the portion of integrated circuit die 201 illustrated includes substrate 231, passivation layer 241, active TSV 261, and passive TSV 262. Passivation layer 241 includes passivation opening 211 that exposes a connection to active TSV 261. Passivation layer 241 includes passivation opening 212 that exposes a connection to passive TSV 262. The portion of integrated circuit die 202 illustrated includes substrate 232, passivation layer 242, wirebond pad 253, wirebond pad 254, active TSV 263, and passive TSV 264. Passivation layer 242 includes passivation opening 215 that exposes a connection to active TSV 263. Passivation layer 242 includes passivation opening 216 that exposes a connection to passive TSV 264. In particular, in FIG. 2B, passivation layer 242 is illustrated as including passivation opening 215 and passivation opening 216 that expose connections to active TSV 263 using wirebond pad 253 and passive TSV 264 using wirebond pad 254, respectively.

In FIG. 2B, integrated circuit die 201 and integrated circuit die 202 are stacked and aligned such that passive TSV 262 is aligned with active TSV 263. Active TSV 261 is not aligned with a TSV on integrated circuit die 202. Passive TSV 264 is not aligned with a TSV on integrated circuit die 201. Connection 273 makes use of the alignment between active TSV 263 and passive TSV 262 to connect active TSV 263 to passive TSV 262. The misalignments of active TSV 261 and passive TSV 264 are used to ensure no connection is made between integrated circuit die 201 and integrated circuit die 202 using active TSV 261 and/or passive TSV 264. In an embodiment, connection 273 may be part of a TSV, metallization, a solder bump, a solder ball, or other 'flip-chip' type connection.

Figure 2C:
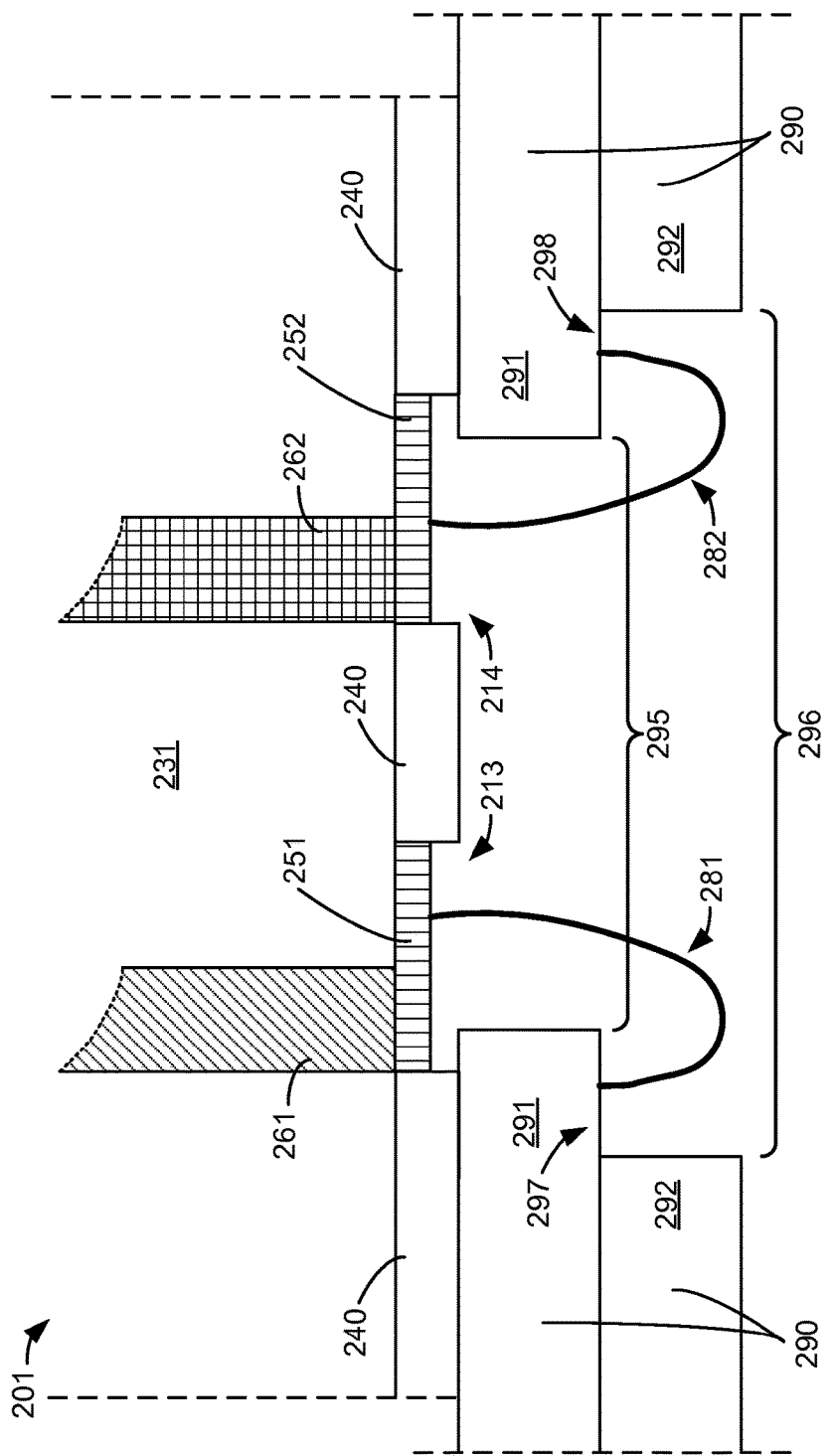
FIG. 2C is an illustration of a two-tiered package wirebonded to connect to active and passive through-silicon vias.

FIG. 2C is an illustration of a two-tiered package wirebonded to connect to active and passive through-silicon vias. In FIG. 2C, integrated circuit die 201 is illustrated stacked on BGA package 290. Integrated circuit die 201 is illustrated 'face-down' (i.e., towards the bottom of FIG. 2C) such that the active circuitry of integrated circuit die 201 is facing the 'top' of BGA package 290.

In FIG. 2C, the portion of integrated circuit die 201 illustrated includes substrate 231, passivation layer 240, wirebond pad 251, wirebond pad 252, active TSV 261, and passive TSV 262. Passivation layer 240 includes passivation opening 213 that exposes a connection to active TSV 261 Passivation layer 240 includes passivation opening 214 that exposes a connection to passive TSV 262. In particular, in FIG. 2C, passivation layer 240 is illustrated as including passivation opening 213 and passivation opening 214 that expose connections to active TSV 261 using wirebond pad 252 and passive TSV 264 using wirebond pad 252, respectively.

The portion of BGA package 290 illustrated includes a substrate including a first tier 291 and second tier 292. First tier 291 of BGA package 290 includes an opening (or 'window') 295 aligned such that passivation opening 213 and passivation opening 214 (and therefore wirebond pad 251 and wirebond pad 252) are accessible for wirebonding. Second tier 292 of BGA package 290 includes an opening (or 'window') 296 aligned such that passivation opening 213 and passivation opening 214 (and therefore wirebond pad 251 and wirebond pad 252) are accessible for wirebonding. Opening 295 has a different width (or other dimension) than opening 296 such that at least one wirebond terrace 297, 298 for package wirebond pads on the first tier is created. In FIG. 2C, opening 295 is illustrated as narrower than opening 296 and aligned such that wirebond terrace 297 is created on the left side of opening 295 and wirebond terrace 298 is created on the right side of opening 295.

Wirebond 281 connects a package wirebond pad on wirebond terrace 297 to wirebond pad 251. Wirebond 282 connects a package wirebond pad on wirebond terrace 298 to wirebond pad 252. Thus, it should be understood that wirebonds from first tier 291 of BGA package 290 can connect to active TSVs (e.g., active TSV 261) or passive TSVs (e.g., passive TSV 262). It should also be understood from FIGS. 2A-2C that passivation openings 211-216 can expose connections to TSVs (e.g, TSVs 261-264 and/or wirebond pads 251-254) that can be used for either a die to die connection or a die to package connection.

Figure 3:
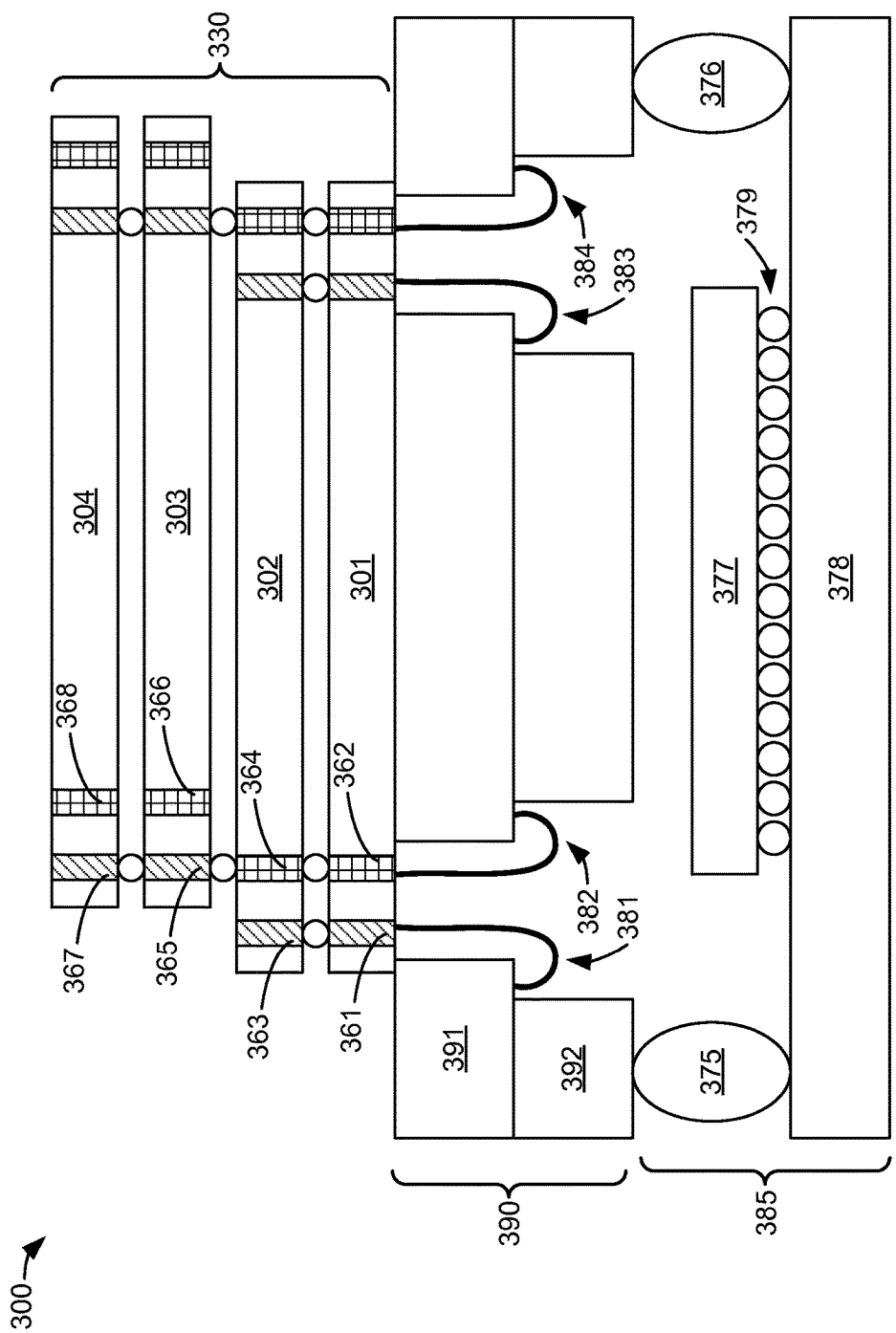
FIG. 3 is an illustration of a stacked die package on package assembly.

FIG. 3 is an illustration of a stacked die package on package assembly. In FIG. 3, assembly 300 comprises (in order from top to bottom in FIG. 3) stacked die 330, BGA package 390, and SoC package 385. Stacked die 330 includes integrated circuit die 301, integrated circuit die 302, integrated circuit die 303, and integrated circuit die 304. In an embodiment, two or more of integrated circuit die 301, integrated circuit die 302, integrated circuit die 303, and integrated circuit die 304 have the same integrated circuit layouts. In another embodiment, two or more of integrated circuit die 301, integrated circuit die 302, integrated circuit die 303, and integrated circuit die 304 have the same layout of active and/or passive TSVs.

Integrated circuit die 301 includes active TSV 361 and passive TSV 362. Integrated circuit die 302 includes active TSV 363 and passive TSV 364. Integrated circuit die 303 includes active TSV 365 and passive TSV 366. Integrated circuit die 304 includes active TSV 367 and passive TSV 368. Integrated circuit die 302 is disposed on top of and aligned (e.g., no offset or rotation) relative to integrated circuit die 301, and connections are provided, such that active TSV 361 is connected to active TSV 363 and passive TSV 362 is connected to passive TSV 364. Integrated circuit die 303 is disposed on top of and aligned (e.g., offset and/or rotated) relative to integrated circuit die 302, and connections are provided, such that passive TSV 364 is connected to active TSV 365. Active TSV 363 is not connected to integrated circuit die 303. Passive TSV 366 is not connected to integrated circuit die 302. Integrated circuit die 304 is disposed on top of and aligned (e.g., no offset or rotation) relative to integrated circuit die 303, and connections are provided, such that active TSV 367 is connected to active TSV 365. Passive TSV 368 is not connected to passive TSV 366. However, in an embodiment, since passive TSV 368 is not connected to the active circuitry of integrated circuit die 304, passive TSV 368 may be connected to passive TSV 366.

BGA package 390 includes a substrate with a first tier 391 and a second tier 392. BGA package 390 includes wirebonds 381-384. The first tier 391 of BGA package 390 includes an opening (or 'window') aligned such that wirebonds 381-384 may connect wirebond pads on first tier 391 to active TSV 361 or passive TSV 362. Second tier 392 of BGA package 390 includes an opening (or 'window') aligned and dimensioned such that at least one wirebond terrace for package wirebond pads on the first tier 391 is created. In FIG. 3, wirebond 381 connects BGA package 390 to active TSV 361 of integrated circuit die 301. Wirebond 382 connects BGA package 390 to passive TSV 362 of integrated circuit die 301.

SoC package 385 includes SoC integrated circuit 377, substrate 378, connections 375, connections 376, and connections 379. Connections 379 connect SoC integrated circuit 377 to substrate 378. Connections 375 and connections 376 connect substrate 378 to BGA package 390. BGA package 390 (and first tier 390 and second tier 391, in particular) can include routing, vias, etc. that can connect connections 375 and connections 376 to wirebonds 381-384. Likewise, SoC package 385 (and substrate 378, in particular) can include routing, vias, etc. that can connect connections 379 to connections 375 and connections 376. Thus, it should be understood that connections can be made between SoC 377 and one or more of integrated circuit dies 301-304 via connections 379, substrate 378, connections 375-376, BGA package 390, wirebonds 381-384, and/or TSVs 361-368. In an embodiment, connections 375-376 may be part of BGA package 390.

In an embodiment, integrated circuit dies 301-304 are memory (e.g., DDR DRAM) integrated circuits. In an embodiment, integrated circuit dies 301-304 are identical. SoC 377 can be connected to a first memory channel having integrated circuit dies 301 and 302 and a second memory channel having integrated circuit dies 303 and 304. SoC 377 can be connected to the first memory channel via active TSVs 361 and 363. SoC 377 can be connected to the second memory channel via passive TSV 362 and 364, and active TSVs 365 and 367.

It should be understood that SoC 377 can access a first DRAM memory channel comprised of integrated circuit die 301 and integrated circuit die 302 via wirebonds 381 and 383 and active TSV 361. SoC 377 can access a second DRAM memory channel comprised of integrated circuit die 303 and integrated circuit die 304 via wirebonds 382 and 384, passive TSV 362, passive TSV 364, and active TSV 365. Thus, access to the second DRAM memory channel uses both active and passive TSVs. This access to the second DRAM memory channel can be achieved by offsetting the second channel (i.e., integrated circuit dies 303 and 304) relative to the first channel (i.e., integrated circuit dies 301 and 302). The first (i.e., 'bottom') integrated circuit die 301 is connected to BGA package 390 by wirebonds. This allows these wirebonds 381-384 to be as short as 1.5 mm. In addition, the wirebond density to connect integrated circuit die 301 to BGA package 390 may be reduced to 25% when compared to standard PoP packaging. Having short wirebonds 381-384 and using TSVs to access integrated circuit dies 302-304 helps increase the channel bandwidth of the first DRAM memory channel and the second DRAM memory channel. In addition, if coarse pitch TSV dimensions are used for TSVs 361-368, some cost savings can be realized.

BGA package 390 is tiered (i.e. comprised of a first tier 391 and second tier 392). The two tiers 391 and 392 have different window dimensions to increase the gap between the top of BGA package 390 and SoC die 377. The routing within BGA package 390 (e.g., routing constructed on first tier 391 and/or second tier 392) can be configured as coplanar waveguides and/or micro-strip transmission lines.

Figure 4:
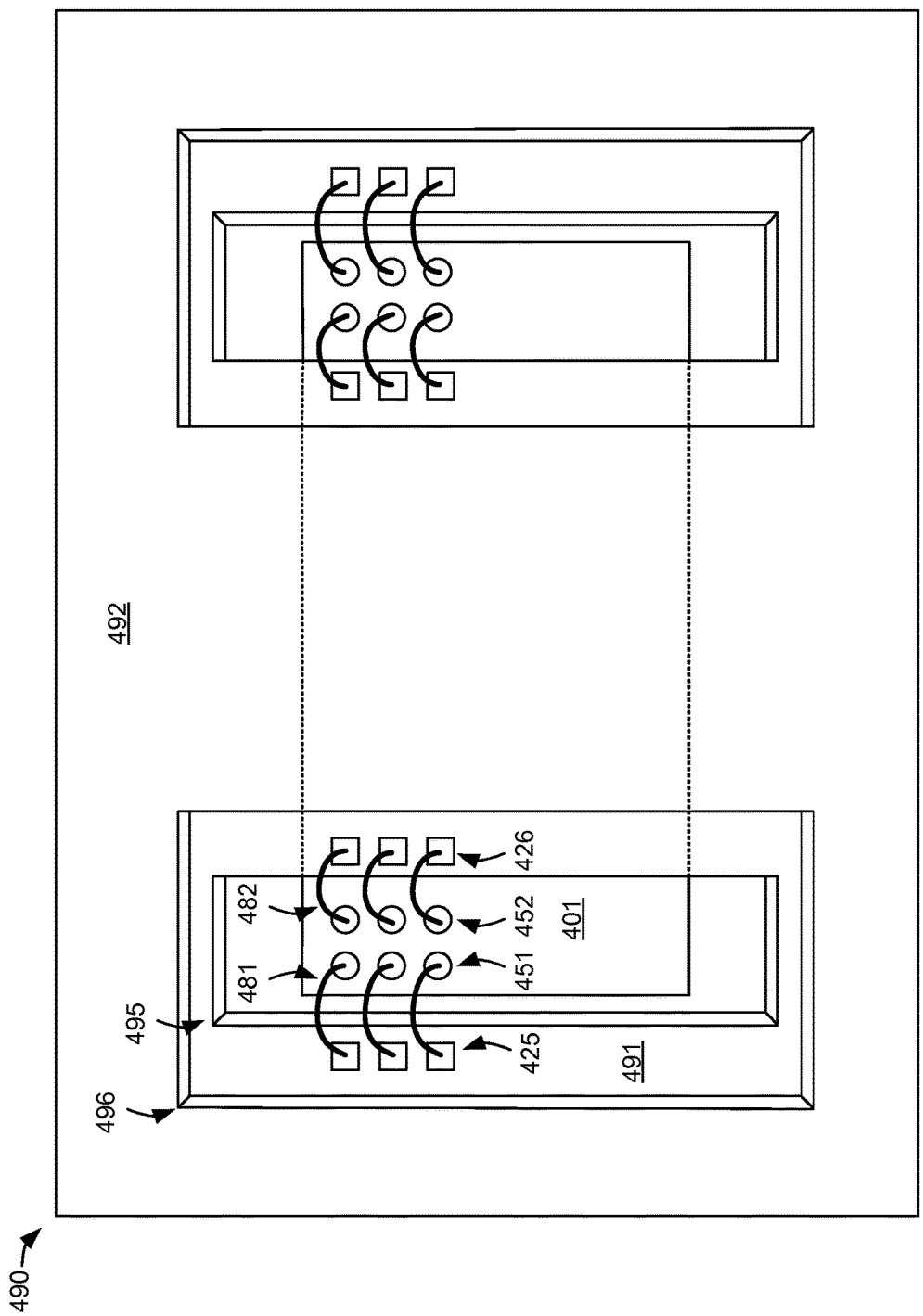
FIG. 4 is a perspective illustration of a two-tiered package wirebonded to connect to active and passive through-silicon vias.

FIG. 4 is a perspective illustration of a two-tiered package wirebonded to connect to active and passive through-silicon vias. FIG. 4 illustrates a view of the 'bottom' (i.e., SoC package side) of a two-tiered package omitting some elements (e.g., BGA balls, internal wiring) for the sake of clarity. In FIG. 4, package 490 comprises first tier 491, second tier 492, and integrated circuit die 401. Integrated circuit die 401 includes wirebond pads (or TSVs) 451 and 452. First tier 491 includes window 495, wirebond pads 425, and wirebond pads 426. Second tier 492 includes window 496. Window 495 and window 496 have different dimensions. In FIG. 4, window 496 is dimensioned wider than window 495 and aligned such that wirebond pads 425 and 426 on first tier 491 can be accessed using window 496. Wirebonds 481 and 482 run from wirebond pads 425 and 426, respectively, through window 495 to wirebond pads 451 and 452, respectively, on integrated circuit die 401.

Figure 5A:
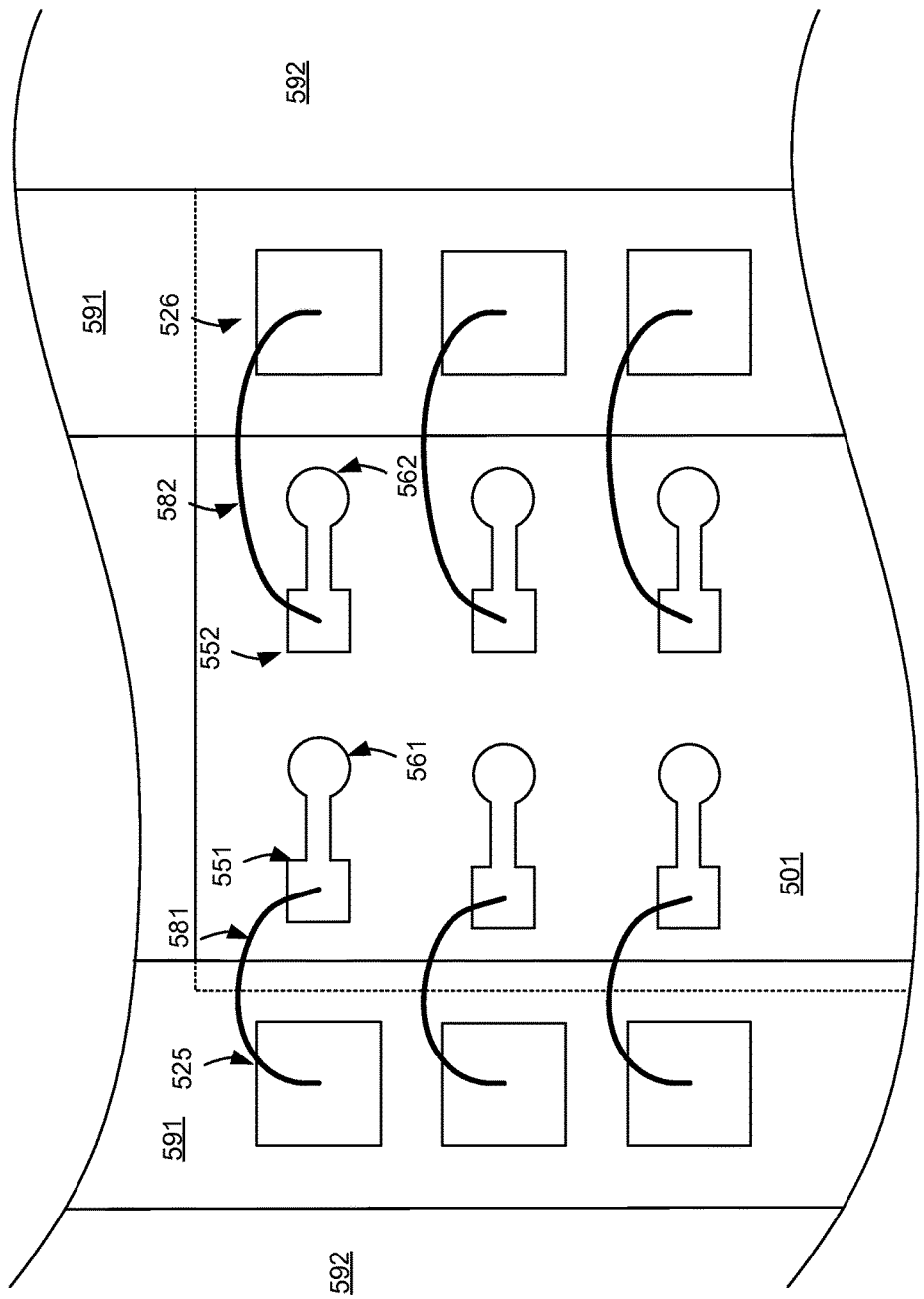
FIG. 5A is an illustration of wirebonding between a two-tiered package and wirebond pads connected to through-silicon vias.

FIG. 5A is an illustration of wirebonding between a two-tiered package and wirebond pads connected to through-silicon vias. FIG. 5A illustrates a view of a section of the 'bottom' (i.e., SoC package side) of a two-tiered package omitting some elements (e.g., BGA balls, internal wiring) for the sake of clarity. In FIG. 5A, the illustrated portion of a package comprises first tier 591, second tier 592, and integrated circuit die 501. Integrated circuit die 501 includes wirebond pad 551, wirebond pad 552, active TSV 561, and passive TSV 562. Active TSV 561 is connected to wirebond pad 551. Passive TSV 562 is connected to wirebond pad 552.

First tier 591 includes wirebond pad 525 and wirebond pad 526. First tier 591 includes a window that allows access (e.g., for wirebonding) to wirebond pads (e.g., wirebond pad 551 and wirebond pad 552) on integrated circuit die 501. Second tier 492 includes a window that allows access (e.g., for wirebonding) to wirebond pads (e.g., wirebond pad 525 and wirebond pad 526) on first tier 591. Wirebond 581 connects wirebond pad 525 on first tier 591 to wirebond pad 551 on integrated circuit die 501. Wirebond 582 connects wirebond pad 526 on first tier 591 to wirebond pad 552 on integrated circuit die 501.

Figure 5B:
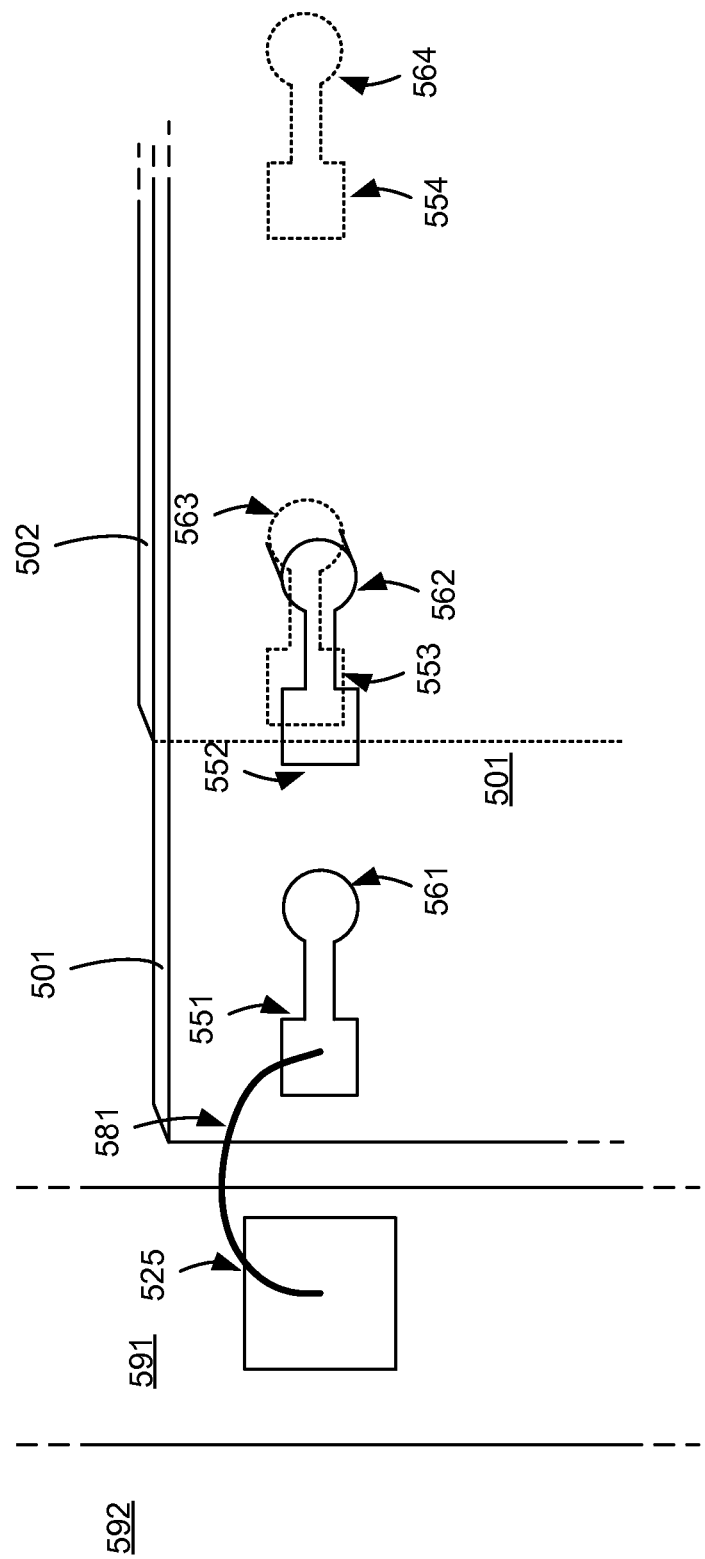
FIG. 5B is an illustration of integrated circuit dies offset to connect passive through-silicon vias to active through-silicon vias.

FIG. 5B is a detail illustration of integrated circuit dies offset to connect passive through-silicon vias to active through-silicon vias. FIG. 5B illustrates a view of a section of the 'bottom' (i.e., SoC package side) of a two-tiered package omitting some elements (e.g., BGA balls, internal wiring) for the sake of clarity. In FIG. 5B, the illustrated portion of a package comprises first tier 591, second tier 592, integrated circuit die 501, and integrated circuit die 502. First tier 591 include wirebond pad 525. Integrated circuit die 501 includes wirebond pad 551, wirebond pad 552, active TSV 561, and passive TSV 562. Integrated circuit die 502 includes wirebond pad 553, wirebond pad 554, active TSV 563, and passive TSV 564. In FIG. 5B, wirebond 581 connects wirebond pad 525 to wirebond pad 551.

In FIG. 5B, integrated circuit die 502 is stacked on, and offset relative to, integrated circuit die 501 such that active TSV 563 on integrated circuit die 502 is aligned with passive TSV 562 on integrated circuit die 501. Thus, without further wirebonds between integrated circuit die 501 and integrated circuit die 502, active TSV 563 can be connected to passive TSV 562. Accordingly, a connection (e.g., wirebond 582) from first tier 591 to wirebond pad 552 on integrated circuit die 501 can access (i.e., connect to) active circuitry on integrated circuit die 502. The connections from the first tier 591 to active circuitry on integrated circuit die 502 can be made via passive TSV 562. The connection from passive TSV 562 to active TSV 563 (and therefore to the active circuitry of integrated circuit die 502) can be achieved by the alignment (i.e., offset and/or rotation) of the stacking of integrated circuit die 502 on integrated circuit die 501.

In an embodiment, integrated circuit die 501 and integrated circuit die 502 have the same integrated circuit layout (i.e., they are identical). Thus, offsetting integrated circuit die 502 relative to integrated circuit die 501 by an amount equal to the spacing of active TSV 561 and passive TSV 562 will align active TSV 563 on integrated circuit die 502 with passive TSV 562 on integrated circuit die 501. In another embodiment, the active circuitry of integrated circuit die 501 and integrated circuit die 502 may be different. However, the layout of active TSVs and passive TSV on integrated circuit dies 501 and 502 may allow for stacking alignments (i.e., offsets and/or rotations—or lack of an offset and/or rotation) that position active TSVs (e.g., TSV 563) on integrated circuit die 502 with passive TSVs (e.g., TSV 562) on integrated circuit die 501. Once aligned, TSVs on integrated circuit dies 501 and 502 may be connected without using wirebonds.

Figure 6:
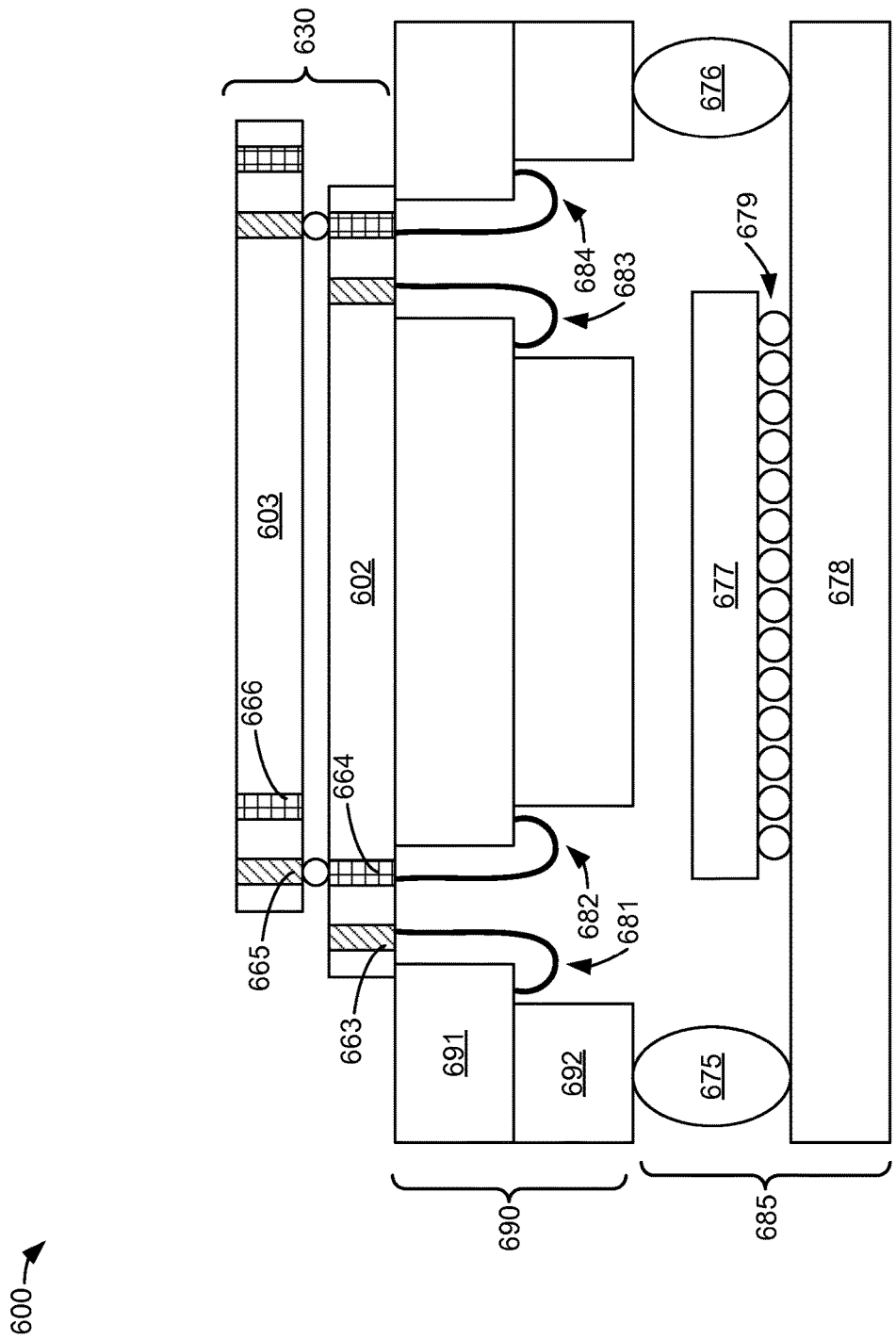
FIG. 6 is an illustration of a stacked die package on package assembly.

FIG. 6 is an illustration of a stacked die package on package assembly. In FIG. 6, assembly 600 comprises (in order from top to bottom in FIG. 6) stacked die 630, BGA package 690, and SoC package 685. Stacked die 630 includes integrated circuit die 602, and integrated circuit die 604. In an embodiment, the two integrated circuit die 602 and integrated circuit die 603 have the same integrated circuit layouts. In another embodiment, the two integrated circuit die 602, and integrated circuit die 604 have the same layout of active and/or passive TSVs.

Integrated circuit die 602 includes active TSV 663 and passive TSV 664. Integrated circuit die 603 includes active TSV 665 and passive TSV 666. Integrated circuit die 603 is disposed on top of and aligned (e.g., offset and/or rotated) relative to integrated circuit die 602, and connections are provided, such that passive TSV 664 is connected to active TSV 665. Active TSV 663 is not connected to integrated circuit die 603. Passive TSV 666 is not connected to integrated circuit die 602.

BGA package 690 includes a substrate with a first tier 691 and a second tier 692. BGA package 690 includes wirebonds 681-684. The first tier 691 of BGA package 690 includes an opening (or 'window') aligned such that wirebonds 681-684 may connect wirebond pads on first tier 691 to active TSV 663 or passive TSV 664. Second tier 692 of BGA package 690 includes an opening (or 'window') aligned and dimensioned such that at least one wirebond terrace for package wirebond pads on the first tier 691 is created. In FIG. 6, wirebond 681 connects BGA package 690 to active TSV 663 of integrated circuit die 602. Wirebond 682 connects BGA package 690 to passive TSV 664 of integrated circuit die 602.

SoC package 685 includes SoC integrated circuit 677, substrate 678, connections 675, connections 676, and connections 679. Connections 679 connect SoC integrated circuit 677 to substrate 678. Connections 675 and connections 676 connect substrate 678 to BGA package 690. BGA package 690 (and first tier 690 and second tier 691, in particular) can include routing, vias, etc. that can connect connections 675 and connections 676 to wirebonds 681-684.

Likewise, SoC package 685 (and substrate 678, in particular) can include routing, vias, etc. that can connect connections 679 to connections 675 and connections 676. Thus, it should be understood that connections can be made between SoC 677 and one or more of integrated circuit dies 602-603 via connections 679, substrate 678, connections 675-676, BGA package 690, wirebonds 681-684, and/or TSVs 663-666. In an embodiment, connections 675-676 may be part of BGA package 690.

In an embodiment, integrated circuit dies 602-603 are memory (e.g., DDR DRAM) integrated circuits. In an embodiment, integrated circuit dies 602-603 are identical. SoC 677 can be connected to a first memory channel having integrated circuit die 602 and 602 and a second memory channel having integrated circuit die 603. SoC 677 can be connected to the first memory channel via active TSV 663. SoC 677 can be connected to the second memory channel via passive TSV 664 and active TSV 665.

It should be understood that SoC 677 can access a first DRAM memory channel comprised of integrated circuit die 602 via wirebonds 681 and 683 and active TSV 663. SoC 677 can access a second DRAM memory channel comprised of integrated circuit die 603 via wirebonds 682, passive TSV 664, and active TSV 665. Thus, access to the second DRAM memory channel uses both active and passive TSVs. This access to the second DRAM memory channel can be achieved by offsetting the second channel (i.e., integrated circuit die 602) relative to the first channel (i.e., integrated circuit die 602). The first (i.e., 'bottom') integrated circuit die 602 is connected to BGA package 690 by wirebonds. This allows these wirebonds 681-684 to be short.

BGA package 690 is tiered (i.e. comprised of a first tier 691 and second tier 692). The two tiers 691 and 692 have different window dimensions to increase the gap between the top of BGA package 690 and SoC die 677. The routing within BGA package 690 (e.g., routing constructed on first tier 691 and/or second tier 692) can be configured as coplanar waveguides and/or micro-strip transmission lines.

The systems and devices described above may be implemented in computer systems, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of integrated circuit die 100, integrated circuit die 201, integrated circuit die 202, BGA package 290, stacked die 330, BGA package 390, SoC package 385, BGA package 490, integrated circuit die 501, integrated circuit die 502, stacked die 630, BGA package 690, SoC package 685, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
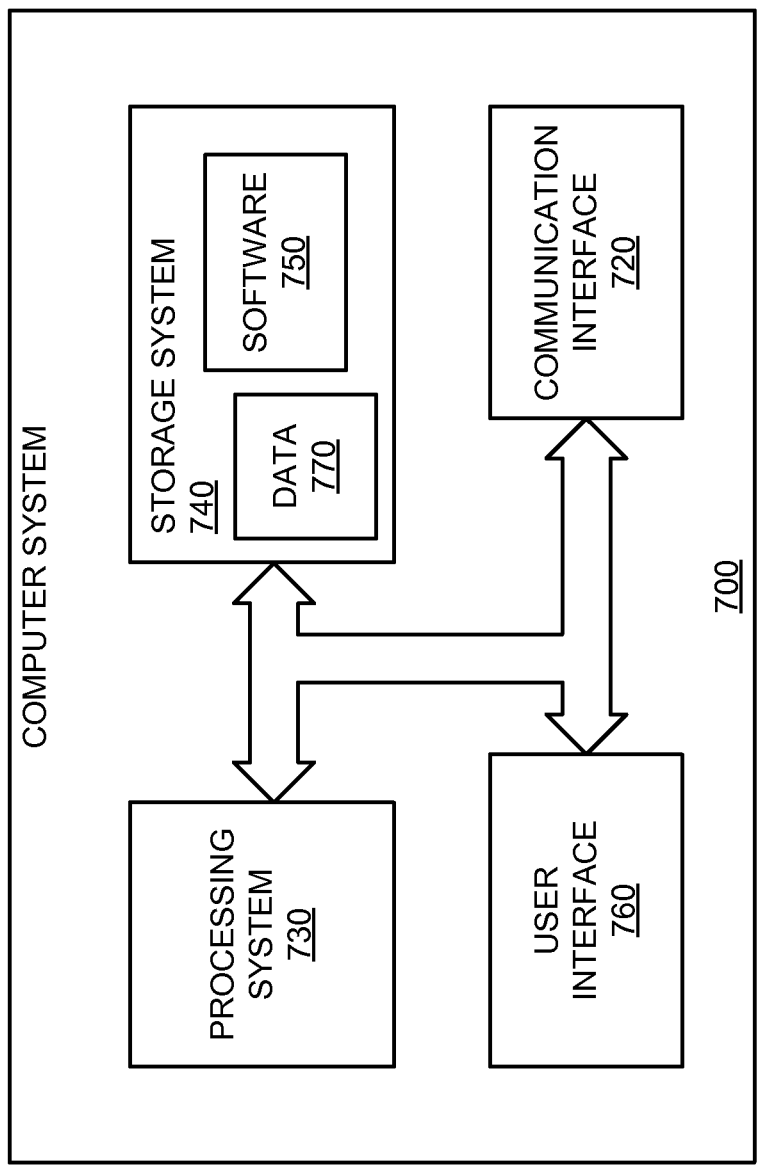
FIG. 7 is a block diagram of a computer system.

FIG. 7 illustrates a block diagram of a computer system. Computer system 700 includes communication interface 720, processing system 730, storage system 740, and user interface 760. Processing system 730 is operatively coupled to storage system 740. Storage system 740 stores software 750 and data 770. Computer system 700 may include one or more of integrated circuit die 100, integrated circuit die 201, integrated circuit die 202, BGA package 290, stacked die 330, BGA package 390, SoC package 385, BGA package 490, integrated circuit die 501, integrated circuit die 502, stacked die 630, BGA package 690, or SoC package 685. Processing system 730 is operatively coupled to communication interface 720 and user interface 760. Computer system 700 may comprise a programmed general-purpose computer. Computer system 700 may include a microprocessor. Computer system 700 may comprise programmable or special purpose circuitry. Computer system 700 may be distributed among multiple devices, processors, storage, and/or interfaces that together comprise elements 720-770.

Communication interface 720 may comprise a network interface, modem, port, bus, link, transceiver, or other communication device. Communication interface 720 may be distributed among multiple communication devices. Processing system 730 may comprise a microprocessor, microcontroller, logic circuit, or other processing device. Processing system 730 may be distributed among multiple processing devices. User interface 760 may comprise a keyboard, mouse, voice recognition interface, microphone and speakers, graphical display, touch screen, or other type of user interface device. User interface 760 may be distributed among multiple interface devices. Storage system 740 may comprise a disk, tape, integrated circuit, RAM, ROM, EEPROM, flash memory, network storage, server, or other memory function. Storage system 740 may include computer readable medium. Storage system 740 may be distributed among multiple memory devices.

Processing system 730 retrieves and executes software 750 from storage system 740. Processing system 730 may retrieve and store data 770. Processing system 730 may also retrieve and store data via communication interface 720. Processing system 730 may create or modify software 750 or data 770 to achieve a tangible result. Processing system 730 may control communication interface 720 or user interface 760 to achieve a tangible result. Processing system may retrieve and execute remotely stored software via communication interface 720.

Software 750 and remotely stored software may comprise an operating system, utilities, drivers, networking software, and other software typically executed by a computer system. Software 750 may comprise an application program, applet, firmware, or other form of machine-readable processing instructions typically executed by a computer system. When executed by processing system 730, software 750 or remotely stored software may direct computer system 700 to operate.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit package, comprising:
   a first integrated circuit die having a first integrated circuit layout;
   a second integrated circuit die having a second integrated circuit layout, the second integrated circuit layout including a plurality of active through-silicon vias and a plurality of passive through-silicon vias, the first integrated circuit die stacked on the second integrated circuit die to align a plurality of active through-silicon vias on said first integrated circuit die with a corresponding plurality of passive through-silicon vias on said second integrated circuit die;
   a substrate having at least a first tier and a second tier, the second integrated circuit die affixed to the substrate, the first tier providing a first opening in the substrate that exposes a first plurality of wire-bond landing pads on the second integrated circuit die that are connected to the plurality of passive through-silicon vias and exposes a second plurality of wire-bond landing pads on the second integrated circuit die that are connected to the plurality of active through-silicon vias, the first tier including routing within the substrate that connects to the first plurality of wire-bond landing pads, the second tier providing a second opening in the substrate that is configured to expose and a corresponding second plurality of landing pads on the first tier;
   a first plurality of wirebond connections from the first plurality of wire-bond landing pads on the second integrated circuit die to the corresponding first plurality of wire-bond landing pads on the first tier; and,
   a second plurality of wirebond connections from the second plurality of wire-bond landing pads on the second integrated circuit die to the corresponding second plurality of wire-bond landing pads on the first tier.

2. The integrated circuit package of claim 1, wherein said first integrated circuit layout and said second integrate circuit layout are the same.

3. The integrated circuit package of claim 1, wherein with respect to the plurality of active through-silicon vias on said first integrated circuit die and a corresponding plurality of active through-silicon vias on said second integrated circuit die, said first integrated circuit layout and said second integrate circuit layout are the same.

4. The integrated circuit package of claim 3, wherein with respect to a plurality of passivation openings on both sides of the first integrated circuit die, the said first integrated circuit layout and said second integrate circuit layout are the same.

5. The integrated circuit package of claim 1, wherein the second integrated circuit layout includes passivation openings on each side of the second integrated circuit die that expose connections to the plurality of active through-silicon vias and the plurality of passive through-silicon vias for a one of a die to die connection and a die to package connection.

6. The integrated circuit package of claim 1, wherein the routing includes at least one coplanar waveguide.

7. The integrated circuit package of claim 1, wherein the routing includes at least one microstrip transmission line.

8. The integrated circuit package of claim 1, wherein the routing includes at least one coplanar waveguide and at least one microstrip transmission line.

9. An integrated circuit package, comprising:
a first integrated circuit die having a layout of active through-silicon vias and passive through-silicon vias;
a second integrated circuit die having the layout of active through-silicon vias and passive through-silicon vias, the layout including a plurality of active through-silicon vias and a plurality of passive through-silicon vias, the first integrated circuit die placed relative to the second integrated circuit die and stacked on the second integrated circuit die to align the layout of active through-silicon vias and passive through-silicon vias such that a plurality of active through-silicon vias on said first integrated circuit die align with a corresponding plurality of passive through-silicon vias on said second integrated circuit die;
a substrate having at least a first tier and a second tier, the second integrated circuit die affixed to the substrate, the first tier providing a first opening in the substrate that exposes a first plurality of wire-bond landing pads on the second integrated circuit die that are connected to the plurality of passive through-silicon vias and exposes a second plurality of wire-bond landing pads on the second integrated circuit die that are connected to the plurality of active through-silicon vias, the second tier providing a second opening in the substrate that is configured to expose a corresponding first plurality of wire-bond landing pads on the first tier and a corresponding second plurality of landing pads on the first tier, the first tier including routing within the substrate that connects to the first plurality of wire-bond landing pads;
a first plurality of wirebond connections from the first plurality of wire-bond landing pads on the second integrated circuit die to the corresponding first plurality of wire-bond landing pads on the first tier; and,
a second plurality of wirebond connections from the second plurality of wire-bond landing pads on the second integrated circuit die to the corresponding second plurality of wire-bond landing pads on the first tier.

10. The integrated circuit package of claim 9, wherein the first integrated circuit die placement relative to the second integrated circuit die includes a rotation of the first integrated circuit die relative to the second integrated circuit die such that the plurality of active through-silicon vias on said first integrated circuit die are not aligned with a corresponding plurality of active through-silicon vias on said second integrated circuit die.

11. The integrated circuit package of claim 9, wherein the first integrated circuit die placement relative to the second integrated circuit die includes an offset of the first integrated circuit die relative to the second integrated circuit die such that the plurality of active through-silicon vias on said first integrated circuit die misalign with a corresponding plurality of active through-silicon vias on said second integrated circuit die.

12. The integrated circuit package of claim 9, wherein the routing includes at least one coplanar waveguide.

13. The integrated circuit package of claim 9, wherein the routing includes at least one microstrip transmission line.

14. The integrated circuit package of claim 9, wherein the routing includes at least one coplanar waveguide and at least one microstrip transmission line.

* * * * *